(12) United States Patent
Johnson et al.

(10) Patent No.: US 10,737,476 B2
(45) Date of Patent: Aug. 11, 2020

(54) METHODS FOR TRANSFERRING GRAPHENE FILMS AND SUBSTRATES COMPRISING GRAPHENE FILMS

(71) Applicant: Corning Incorporated, Corning, NY (US)

(72) Inventors: Benedict Yorke Johnson, Horseheads, NY (US); Xinyuan Liu, Painted Post, NY (US); Prantik Mazumder, Ithaca, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 15/756,388

(22) PCT Filed: Aug. 30, 2016

(86) PCT No.: PCT/US2016/049393
§ 371 (c)(1),
(2) Date: Feb. 28, 2018

(87) PCT Pub. No.: WO2017/040469
PCT Pub. Date: Mar. 9, 2017

(65) Prior Publication Data
US 2018/0257359 A1    Sep. 13, 2018

Related U.S. Application Data

(60) Provisional application No. 62/212,832, filed on Sep. 1, 2015.

(51) Int. Cl.
*B32B 37/00* (2006.01)
*C03C 17/22* (2006.01)
(Continued)

(52) U.S. Cl.
CPC .............. *B32B 37/025* (2013.01); *B32B 7/06* (2013.01); *B32B 9/04* (2013.01); *B32B 37/26* (2013.01);
(Continued)

(58) Field of Classification Search
CPC .......... B32B 2037/268; B32B 2255/26; B32B 37/025; B32B 37/26; B32B 38/10;
(Continued)

(56) References Cited

U.S. PATENT DOCUMENTS

| 4,483,700 A | 11/1984 | Forker, Jr. et al. |
| 5,674,790 A | 10/1997 | Araujo |

(Continued)

FOREIGN PATENT DOCUMENTS

| CN | 103332680 A | 10/2013 |
| CN | 104192832 A | 12/2014 |
| WO | 2011046775 A1 | 4/2011 |

OTHER PUBLICATIONS

English translation of CN103332680.*
Chen et al; "High-Quality and Efficient Transfer of Large-Area Graphene Films Onto Different Substrates"; Carbon, 56 (2013) pp. 271-278.
(Continued)

*Primary Examiner* — Sonya M Sengupta
(74) *Attorney, Agent, or Firm* — Svetlana Z. Short

(57) ABSTRACT

Disclosed herein are methods for transferring a graphene film onto a substrate, the methods comprising applying a polymer layer to a first surface of a graphene film, wherein a second surface of the graphene film is in contact with a growth substrate; applying a thermal release polymer layer to the polymer layer; removing the growth substrate to form a transfer substrate comprising an exposed graphene surface; and contacting the exposed graphene surface with a target substrate. Transfer substrates comprising a graphene film, a thermal release polymer layer, and a polymer layer are also disclosed herein.

20 Claims, 6 Drawing Sheets

(51) Int. Cl.
- C23C 16/01 (2006.01)
- C23C 16/26 (2006.01)
- C01B 32/194 (2017.01)
- B32B 7/06 (2019.01)
- B32B 9/04 (2006.01)
- B32B 37/26 (2006.01)
- B32B 38/10 (2006.01)

(52) U.S. Cl.
CPC ............ *B32B 38/10* (2013.01); *C01B 32/194* (2017.08); *C03C 17/22* (2013.01); *C23C 16/01* (2013.01); *C23C 16/26* (2013.01); *B32B 2037/268* (2013.01); *B32B 2255/26* (2013.01); *C01P 2002/82* (2013.01); *C01P 2002/84* (2013.01); *C01P 2004/24* (2013.01); *C03C 2217/28* (2013.01)

(58) Field of Classification Search
CPC .. B32B 7/06; B32B 9/04; C23C 16/01; C23C 16/26; C03C 17/22; C03C 2217/28; C01P 2002/82; C01P 2002/84; C01P 2004/24; C01B 32/194
USPC .................................................. 156/247, 249
See application file for complete search history.

(56) References Cited

U.S. PATENT DOCUMENTS

| 7,666,511 | B2 | 2/2010 | Ellison et al. |
| 2011/0030879 | A1 | 2/2011 | Veerasamy |
| 2012/0244358 | A1 | 9/2012 | Lock et al. |
| 2012/0258311 | A1* | 10/2012 | Hong ............... B82Y 30/00 428/408 |
| 2013/0065034 | A1 | 3/2013 | Muramatsu |
| 2013/0210218 | A1 | 8/2013 | Accardi et al. |
| 2015/0371848 | A1* | 12/2015 | Zaretski ........... H01L 21/02527 438/496 |

OTHER PUBLICATIONS

International Search Report and Written Opinion of the International Searching Authority; PCT/US2016/049393; dated Nov. 21, 2016; 12 Pages; European Patent Office.

Kang et al; "Efficient Transfer of Large-Are Graphene Films Onto Rigid Substrates by Hot Pressing"; Nano; vol. 6, No. 6; p. 5360-5365 (2012).

Unarunotai et al; "Transfer of Graphene Layers Grown on SiC Wafers to Other Substrates and Their Integration Into Field Effect Transistors"; Appl. Phys. Lett. 95, (2009) pp. 202101-1-202101-3.

* cited by examiner

METHODS FOR TRANSFERRING GRAPHENE FILMS AND SUBSTRATES COMPRISING GRAPHENE FILMS

CROSS-REFERENCE TO RELATED APPLICATIONS

This application claims the benefit of priority under 35 U.S.C § 365 of International Patent Application Serial No. PCT/US2016/049393 filed on Aug. 30, 2016 designating the United States of America, the content of which is relied upon and incorporated herein by reference in its entirety, which in turn claims the benefit of priority under 35 U.S.C. § 119 of U.S. Provisional Application Ser. No. 62/212,832 filed on Sep. 1, 2015, the content of which is relied upon and incorporated herein by reference in its entirety.

FIELD OF THE DISCLOSURE

The disclosure relates generally to methods for transferring graphene films, and more particularly to the transfer of graphene films from a growth substrate to a target substrate using polymer and thermal release polymer support layers, as well as transfer substrates comprising a graphene film supported by such layers.

BACKGROUND

Graphene, a two-dimensional carbon material, can be useful in a wide variety of applications due to desirable properties such as chemical stability, mechanical strength, flexibility, transmittance, intrinsic carrier mobility, tunable band gap, and thermal and/or electrical conductivity. For example, graphene can potentially be used to replace conductive oxide films, e.g., indium tin oxide (ITO), in various devices such as displays, touch panel devices, or solar cells. Other useful applications for graphene films include field effect transistors, energy or thermal management devices, smart windows, and chemical or biological sensors. Certain applications call for transparent substrates coated with conductive films such as ITO or graphene, e.g., organic light-emitting diodes (OLEDs) or transparent conducting electrodes. Because graphene can remain conductive and stable even at the molecular level, graphene may play an important role in the next generation of electronics, e.g., enabling the development of smaller and/or lower power devices.

Several different methods have been employed for preparing graphene, including mechanical exfoliation from highly ordered pyrolytic graphite (HOPG), chemical reduction of graphite oxide, and high temperature annealing of single crystal silicon carbide. However, these methods may have various disadvantages in terms of scalability and/or manufacturing expense. Chemical vapor deposition (CVD) and plasma-enhanced CVD (PECVD) methods have shown promise as scalable and/or economical processes for growing graphene films on substrates. However, CVD typically utilizes a catalyst, such as Cu or Ni metals, and often requires additional steps such as transfer and/or catalyst removal steps. The CVD process may thus result in wrinkles, holes, and/or metal etching residues on the coated substrate, which may complicate subsequent applications.

The ability to successfully transfer synthesized graphene films onto a variety of substrates can be important for many end use applications. For example, if a user wants to flow electrical current through a graphene film, the conducting catalyst surface (or metal foil) should be removed and the graphene film transferred to an insulating substrate to avoid shorting out the device. Various methods have been developed for transferring graphene films onto different substrates, such as the use of polymethylmethacrylate (PMMA) or thermal release tape (TRT) to support the graphene film during transfer. For example, a transfer layer of PMMA or TRT can be applied to the graphene film to prevent folding, tearing, and/or wrinkling while the growth substrate or catalyst layer is etched away.

PMMA transfer methods can include, for instance, coating a layer of PMMA onto a graphene film on a growth substrate (e.g., metal substrate), etching or otherwise removing the growth substrate, and transferring the PMMA/graphene stack onto a target substrate. Solvents can be used to dissolve the PMMA and complete the graphene transfer. However, PMMA has a relatively low structural rigidity, which can make handling and transferring of large-scale graphene films difficult, if not impossible. TRT transfer methods include attaching a pre-cut TRT to a graphene film on a growth substrate, etching or otherwise removing the growth substrate, and transferring the TRT/graphene stack to a target substrate. Heat can be applied to reduce or eliminate the adhesion strength of the tape such that the TRT can be peeled off. While TRT transfer methods may be more easily scalable for production of larger graphene films, these methods may undesirably contaminate the graphene film surface with adhesive residues from the TRT. Such resides may be difficult to remove and/or the solvents used to remove the residues can adversely affect the electrical and/or optical performance of the graphene film. In addition, pressure applied to the TRT during the transfer process can also cause undesired deformations in the graphene film which may degrade the electrical and/or optical properties of the transferred film.

Accordingly, it would be advantageous to provide methods for transferring graphene films from a growth substrate to a target substrate without negatively impacting the physical, optical, and/or electrical properties of the transferred graphene film. Additionally, it would be advantageous to provide processes for the transfer of graphene films which are scalable and/or cost-effective. It would further be advantageous to provide transfer substrates comprising supported graphene films having improved properties.

SUMMARY

The disclosure relates, in various embodiments, to methods for transferring a graphene film onto a substrate, the methods comprising applying a polymer layer to a first surface of a graphene film, wherein a second surface of the graphene film is in contact with a growth substrate; applying a thermal release polymer layer to the polymer layer; removing the growth substrate to form a transfer substrate comprising an exposed graphene surface; and contacting the exposed graphene surface with a target substrate.

According to various embodiments, the growth substrate can be chosen from metal substrates, such as transition metal substrates. The target substrate can be chosen from glass substrates according to additional embodiments. The graphene film can be deposited on the growth substrate by CVD or PECD methods. In some embodiments, the polymer layer can comprise poly(methyl methacrylate) (PMMA), poly(lactic acid) (PLA), or polycarbonate (PC). The polymer layer can be applied to the graphene film, e.g., by dip coating, spin coating, or spray coating. According to certain embodiments, the thermal release polymer layer can comprise polydimethylsiloxane or polyurethane. The thermal release polymer can, for example, be applied to the polymer layer by pressing, roll-to-roll transfer, or lamination techniques.

The growth substrate can be removed, e.g., by etching in an acidic or basic solution. Removal of the thermal release polymer can comprise, in some embodiments, heating to a temperature at or above its release temperature and peeling the thermal release polymer off the polymer layer. According to non-limiting embodiments, the polymer layer can be removed by soaking in an organic solvent for a period of time sufficient to dissolve the polymer layer. After transfer, the graphene film can be further treated, e.g., by cleaning or annealing the graphene film.

Also disclosed herein are transfer substrates comprising a graphene film, a thermal release polymer layer, and a polymer layer disposed therebetween. The transfer substrate can further comprise at least one additional layer in contact with the graphene film, wherein the additional layer is chosen from metal and glass layers. The polymer layer can have a thickness ranging from about 50 nm to about 200 nm, the thermal release polymer can have a thickness ranging from about 100 nm to about 500 nm, and/or the graphene film can have a thickness ranging from about 0.3 nm to about 200 nm. In certain embodiments, the graphene film can have a transmittance of at least about 80% in the visible light spectrum (400-700 nm) and/or a sheet resistance of less than about 3 KΩ/sq.

Additional features and advantages of the disclosure will be set forth in the detailed description which follows, and in part will be readily apparent to those skilled in the art from that description or recognized by practicing the methods as described herein, including the detailed description which follows, the claims, as well as the appended drawings.

It is to be understood that both the foregoing general description and the following detailed description present various embodiments of the disclosure, and are intended to provide an overview or framework for understanding the nature and character of the claims. The accompanying drawings are included to provide a further understanding of the disclosure, and are incorporated into and constitute a part of this specification. The drawings illustrate various embodiments of the disclosure and together with the description serve to explain the principles and operations of the disclosure.

BRIEF DESCRIPTION OF THE DRAWINGS

The following detailed description can be further understood when read in conjunction with the following drawings.

DETAILED DESCRIPTION

Figure 1:
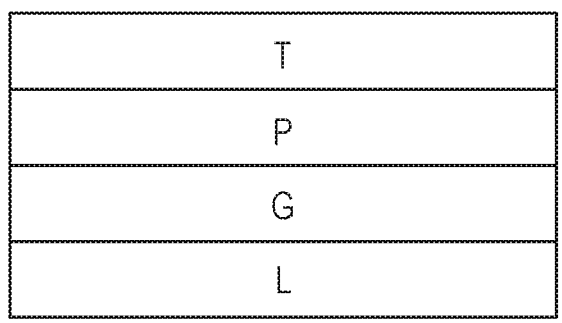
FIG. 1 depicts an exemplary transfer substrate comprising a graphene film.

The following description is intended to provide a detailed overview of certain embodiments of the claimed methods and substrates. Various aspects will be specifically discussed throughout the disclosure with reference to non-limiting embodiments, these embodiments being interchangeable with one another within the context of the disclosure.

Methods

Disclosed herein are methods for transferring a graphene film onto a substrate, the methods comprising applying a polymer layer to a first surface of a graphene film, wherein a second surface of the graphene film is in contact with a growth substrate; applying a thermal release polymer layer to the polymer layer; removing the growth substrate to form a transfer substrate comprising an exposed graphene surface; and contacting the exposed graphene surface with a target substrate.

Graphene films can be formed or grown on a variety of substrates using a variety of deposition methods. Exemplary growth substrates can include, but are not limited to, metal substrates, such as transition metal substrates, e.g., copper, nickel, cobalt, or alloys thereof, and the like; crystalline substrates such as sapphire; glass substrates, and glass-ceramic substrates. According to various embodiments, the growth substrate can have a melting point higher than the deposition temperature, e.g., higher than about 1000° C., such as ranging from about 1000° C. to about 3000° C., from about 1250° C. to about 2750° C., from about 1500° C. to about 2500° C., or from about 1750° C. to about 2250° C., including all ranges and subranges therebetween. In additional embodiments, the growth substrate can be chosen from metal foils or sheets. The growth substrate can, in some embodiments, serve as both a deposition catalyst and substrate, e.g., in the case of copper or nickel substrates. Alternatively, one or more catalysts can be provided on a surface of the growth substrate.

CVD or PECVD processes can, in some embodiments, be employed to deposit or otherwise form a graphene film on a growth substrate. Such methods can be carried out by placing the growth substrate in a furnace or other suitable vessel or chamber and heating the substrate to a deposition temperature. Exemplary deposition temperatures can range, for example, from about 500° C. to about 1400° C., such as from about 600° C. to about 1300° C., from about 700° C. to about 1200° C., from about 800° C. to about 1100° C., or from about 900° C. to about 1000° C., including all ranges and subranges therebetween. Hydrogen gas can be introduced into the chamber, which may be under vacuum, at a rate ranging, for instance, from 0 to about 40 sccm, such as from about 1 sccm to about 35 sccm, from about 5 sccm to about 30 sccm, from about 10 sccm to about 25 sccm, or from about 15 sccm to about 20 sccm, including all ranges and subranges therebetween. A carbon-source gas can also be introduced into the chamber, for example, at a rate ranging from about 1 sccm to about 20 sccm, such as from about 2 sccm to about 18 sccm, from about 3 sccm to about 15 sccm from about 4 sccm to about 12 sccm, from about 5 sccm to about 10 sccm, or from about 6 sccm to about 8 sccm, including all ranges and subranges therebetween. Suitable carbon-source gases can include, but are not limited to, $CH_4$, $C_2H_2$, $C_2F_6$, $CHF_3$, or $CF_4$, to name a few.

According to various embodiments, heat in the chamber can pyrolyze the carbon-source gas to produce carbon, which can then be deposited on a surface of the growth substrate. Hydrogen gas, if used, can catalyze a reaction between the growth substrate surface and the carbon-source gas to promote carbon deposition. In the case of PECVD, in addition to heat, the chamber can be exposed to dielectric current (RF), direct current (DC), and/or microwaves (MW) to ionize the gases within the chamber to further promote carbon deposition. Plasma generated using RF can include, for example, inductively coupled plasma (ICP) or capacitively coupled plasma (CCP). In some embodiments, RF power can range from about 50 W to about 200 W, such as from about 75 W to about 175 W, or from about 100 W to about 150 W, including all ranges and subranges therebetween.

Exemplary deposition times can range, in some embodiments, from about 1 minute to about 30 minutes, such as from about 2 minutes to about 20 minutes, from about 3 minutes to about 15 minutes, from about 4 minutes to about 12 minutes, from about 5 minutes to about 10 minutes, or from about 6 minutes to about 8 minutes, including all ranges and subranges therebetween. The graphene film deposited on the growth substrate can have any desired thickness, e.g., ranging from one to several layers of graphene. In some embodiments, the graphene film can comprise one layer or two or more layers, such as 3, 4, 5, 6, 7, 8, 9, 10, 15, 20, or more layers. The thickness of an individual graphene layer can range, for example, from about 0.3 nm to about 10 nm, such as from about 0.35 nm to about 9 nm, from about 0.4 nm to about 8 nm, from about 0.7 nm to about 7 nm, from about 1 nm to about 6 nm, from about 2 nm to about 5 nm, or from about 3 nm to about 4 nm, including all ranges and subranges therebetween. The overall thickness of the graphene film can range, for example, from about 0.3 nm to about 200 nm, such as from about 0.7 nm to about 175 nm, from about 1 nm to about 150 nm, from about 2 nm to about 125 nm, from about 3 nm to about 100 nm, from about 4 nm to about 75 nm, from about 5 nm to about 50 nm, from about 6 nm to about 25 nm, from about 7 nm to about 10 nm, or from about 8 nm to about 10 nm, including all ranges and subranges therebetween.

After deposition of the graphene film on the growth substrate, a polymer layer can be applied or coated onto an exposed surface of the graphene film. Of course, a growth substrate comprising a graphene film can also be purchased or otherwise supplied. Optionally, prior to applying the polymer layer, the graphene layer on the growth substrate may be flattened or otherwise shaped, such as by pressing the coated growth substrate between two plates. Suitable polymer layers can comprise, for example, thermoplastic polymers, such as poly(methyl methacrylate) (PMMA), polycarbonate (PC), or poly(lactic acid) (PLA). In some embodiments, the polymer layer can comprise PMMA. Polymers having a relatively high wetting capability may be advantageous for providing a uniform and/or conformal coating on the graphene surface which can, in turn, result in higher transfer efficiency (i.e., graphene coverage on the target substrate).

The polymer layer can be applied to the graphene film, for instance, by dip coating, spin coating, spray coating, or other similar techniques. After coating, the polymer layer can be thermally treated, for instance, at a temperature ranging from about 80° C. to about 150° C., such as from about 90° C. to about 140° C., from about 100° C. to about 130° C., or from about 110° C. to about 120° C., including all ranges and subranges therebetween. Thermal treatment times can range, in various embodiments, from about 1 minute to about 60 minutes, such as from about 2 minutes to about 50 minutes, from about 3 minutes to about 45 minutes, from about 4 minutes to about 30 minutes, from about 5 minutes to about 20 minutes, or from about 10 minutes to about 15 minutes, including all ranges and subranges therebetween.

A thermal release polymer layer can be applied to the polymer layer, for example, by pressing, lamination, and/or roll-to-roll transfer, to name a few non-limiting techniques. In some embodiments, the thermal release polymer can be applied to the polymer layer and the resulting stack can be placed in a press or other suitable device for applying pressure. The applied pressure can range, for example, from about 100 psi (0.6895 MPa) to about 1000 psi (6.895 MPa), such as from about 150 psi (1.034 MPa) to about 750 psi (5.171 MPa), from about 200 psi (1.379 MPa) to about 600 psi (4.137 MPa), or from about 250 psi (1.724 MPa) to about 500 psi (3.448 MPa), including all ranges and subranges therebetween.

Thermal release polymers include polymers that exhibit adhesion at temperatures at or near room temperature and can be removed (e.g., peeled away) at elevated temperatures. Suitable thermal release polymers can be chosen, by way of non-limiting example, from polydimethylsiloxanes (PDMS) and polyurethanes (PU). In some embodiments, the thermal release polymer can comprise a thermal release tape (TRT). Thermal release tapes can comprise, for example, a base polymer film and a thermal release adhesive layer. Thermal release tapes may adhere tightly to a substrate (e.g., the polymer layer) at room temperature, but can be easily peeled off at elevated temperatures (e.g., about 100° C. or greater).

After application of the thermal release polymer layer, the growth substrate can be removed from or etched off the graphene film. In some embodiments, depending on the growth conditions, graphene may be present on both sides of the growth substrate. In such instances, it may be desirable to remove graphene from the reverse side of the growth substrate prior to etching. Such a pre-etching step can comprise, for example, contacting the graphene layer on the reverse side with an acidic or basic solution, such as nitric acid (e.g., 10 wt %) for a period of time up to about five minutes, such as two or three minutes. Alternatively, the graphene layer on the reverse side, if present, can be simultaneously etched away during etching of the growth substrate.

Etching can be carried out, for example, by placing all or a portion of the substrate in an acidic or basic etchant for a period of time sufficient to dissolve, react, or otherwise remove the growth substrate. For example, the coated substrate can be immersed in a bath or floated on the surface such that the growth substrate is exposed to the etchant. Suitable etchants can include, by way of non-limiting example, iron chloride ($FeCl_3$), copper chloride ($CuCl_2$), hydrochloric acid (HCl), hydrobromic acid (HBr), nitric acid ($HNO_3$), sulfuric acid ($H_2SO_4$), phosphoric acid ($H_3PO_4$), ammonium persulfate (($NH_4)_2S_2O_8$), iron nitrate ($Fe(NO_3)$ $_3$), copper sulfate ($Cu_2SO_4$), hydrogen peroxide ($H_2O_2$), and combinations thereof, to name a few. Solutions comprising one or more etchants can be used according to various embodiments, wherein the total etchant concentration can range from about 0.1 M to about 2 M, such as from about 0.3 M to about 1.5 M, or from about 0.5 M to about 1 M, including all ranges and subranges therebetween.

Etching can be carried out at room temperature or at elevated temperatures, for example, from about 25° C. to about 60° C., such as from about 30° C. to about 50° C., or from about 35° C. to about 40° C., including all ranges and subranges therebetween. Suitable etching times can range, in various embodiments, from about 30 minutes to about 12 hours, such as from about 1 hour to about 10 hours, from about 2 hours to about 8 hours, from about 3 hours to about 6 hours, or from about 4 hours to about 5 hours, including all ranges and subranges therebetween. It is within the ability of one skilled in the art to vary the etching time and/or temperature as desired to suit a particular etchant and/or growth substrate.

A transfer substrate (e.g., supported graphene film) having an exposed graphene surface can thus be obtained after etching or otherwise removing the growth substrate. The graphene film of the transfer substrate can then be transferred onto a new (target) substrate. Optionally, the transfer substrate can be rinsed prior to transfer, e.g., with water, deionized water, alcohol, or any other suitable solvent. The target substrate can be chosen from any substrates without limitation, for example, glass substrates, glass-ceramic substrates, crystalline substrates, metal substrates, plastic substrates, or polymer substrates, to name a few. In certain embodiments, the target substrate may be chosen from insulating substrates. According to additional embodiments, the target substrate can be chosen from glass substrates, such as glass sheets.

The exposed graphene surface of the transfer substrate can be brought into contact with a surface of the target substrate, optionally with the application of force. For example, the target substrate and supported graphene can be pressed together using an applied force or can be vertically stacked, in which case the applied force may be gravity, alone or in combination with additional applied force. In some embodiments, the transfer substrate can be brought into contact with the target substrate and the resulting stack can be placed in a press or other suitable device for applying pressure. The applied pressure can range, for example, from about 100 psi (0.6895 MPa) to about 1000 psi (6.895 MPa), such as from about 150 psi (1.034 MPa) to about 750 psi (5.171 MPa), from about 200 psi (1.379 MPa) to about 600 psi (4.137 MPa), or from about 250 psi (1.724 MPa) to about 500 psi (3.448 MPa), including all ranges and subranges therebetween. According to various non-limiting embodiments, the target substrate and supported graphene can be contacted using roll-to-roll transfer methods.

Removal of the polymer and thermal release polymer layers can be carried out after contacting the exposed graphene surface with the target substrate. For example, the thermal release polymer layer can be removed by heating to a temperature sufficient to reduce or eliminate the adhesion of the thermal release polymer layer to the polymer layer, e.g., a temperature at or above the polymer's release temperature. Removal can be carried out by peeling or otherwise pulling the thermal release polymer off of the polymer layer. Suitable temperatures can range, in some embodiments, from about 100° C. to about 200° C., such as from about 110° C. to about 180° C., from about 120° C. to about 170° C., from about 130° C. to about 160° C., or from about 140° C. to about 150° C., including all ranges and subranges therebetween. It is within the ability of one skilled in the art to select a thermal treatment temperature suitable for removing a given thermal release polymer.

Removal of the polymer layer can comprise soaking in an organic solvent for a period of time sufficient to dissolve or otherwise remove the polymer layer. Removal can be carried out by placing all or a portion of the substrate in an organic solvent, for example, the substrate can be immersed in a bath or floated on the surface such that the polymer layer is exposed to the organic solvent. In various embodiments, the polymer layer is soluble in the chosen organic solvent, e.g., a reactant is not necessary to remove the polymer layer. Mild removal conditions in the absence of a reactant may reduce or eliminate any adverse effects on the graphene film and/or target substrate. Suitable organic solvents can be chosen, for instance, from acetone, acetic acid, chloroform, dichloromethane, and the like. Soak times can range, in some embodiments, from about 15 minutes to about 1 hour, such as from about 20 minutes to about 45 minutes, from about 25 minutes to about 40 minutes, or from about 30 minutes to about 35 minutes, including all ranges and subranges therebetween. Removal of the polymer layer can be carried out at room temperature or elevated temperatures, such as from about 25° C. to about 60° C., from about 30° C. to about 50° C., or from about 35° C. to about 40° C., including all ranges and subranges therebetween.

Optionally, the polymer layer can be pre-treated before removal, e.g., by exposure to an organic compound which may soften the polymer and/or reduce residues on the graphene film. Suitable organic compounds can include, for example, N-methyl-2-pyrrolidone, chloroform, acetonitrile, and combinations thereof. Exemplary pre-treatment exposure times can range, for example, from about 1 hour to about 6 hours, such as from about 2 hours to about 5 hours, or from about 3 hours to about 4 hours, including all ranges and subranges therebetween. It is within the ability of one skilled in the art to select a combination of suitable parameters for removal and/or pre-treatment for a given polymer layer.

Upon removal of the polymer and thermal release polymer layer supports, a coated substrate comprising the transferred graphene film can be obtained. Such a coated substrate can be subsequently treated as desired using any variety of post-transfer steps including, but not limited to, cleaning and/or annealing steps. For example, the coated substrate can be rinsed with one or more suitable solvents, such as water, deionized water, chloroform, and alcohols, such as isopropanol, methanol, ethanol, and the like, or combinations thereof. Annealing of the graphene film on the coated substrate can be carried out, in certain embodiments, at a temperature ranging from about 100° C. to about 400° C., such as from about 150° C. to about 300° C., or from about 200° C. to about 250° C., including all ranges and subranges therebetween. Annealing times can range, for instance, from about 15 minutes to about 1 hour, such as from about 20 minutes to about 45 minutes, from about 25 minutes to about 40 minutes, or from about 30 minutes to about 35 minutes, including all ranges and subranges therebetween. According to various embodiments, annealing may be carried out in an inert environment, optionally under vacuum.

The methods disclosed herein can further include additional steps that can be carried out before transfer of the graphene film onto the target substrate. For instance, the target substrate can optionally be cleaned to remove contaminants from the target surface, to improve the adhesion strength between the transferred graphene and the target substrate, and/or to increase the hydrophilicity of the target surface. Cleaning can be carried out, e.g., using water and/or acidic or basic solutions. In some embodiments, the substrate can be cleaned using water or a solution comprising HCl, $H_2SO_4$, $NH_4OH$ and/or $H_2O_2$. The substrate can, for example, be rinsed or washed for a period of time ranging from about 1 minute to about 10 minutes, such as from about 2 minutes to about 8 minutes, from about 3 minutes to about 6 minutes, or from about 4 minutes to about 5 minutes, including all ranges and subranges therebetween. The cleaning step can be carried out at ambient or elevated temperatures, e.g., temperatures ranging from about 25° C. to about 150° C., such as from about 50° C. to about 125° C., from about 65° C. to about 100° C., or from about 75° C. to about 95° C., including all ranges and subranges therebetween. According to various embodiments, cleaning can also comprise plasma treating one or more surfaces of the substrate. Ultrasonic energy can also be applied during the cleaning step in some embodiments. Other additional optional steps can include, for example, cutting, polishing, grinding, and/or edge-finishing of the target substrate, to name a few.

Substrates

Disclosed herein are transfer substrates comprising a graphene film, a thermal release polymer layer, and a polymer layer disposed therebetween. The substrates will be discussed with reference to FIG. 1, which is intended to provide a general overview of certain embodiments of the claimed substrates. Additional aspects will be specifically discussed throughout the disclosure with reference to non-limiting embodiments, these embodiments being interchangeable with each other and with the embodiments disclosed with respect to the methods, and vice versa.

As shown in FIG. 1, a transfer substrate can comprise a graphene film G, a thermal release polymer layer T, and a polymer layer P disposed therebetween. Optionally, as shown in FIG. 1, the transfer substrate can further comprise an additional layer L in contact with the graphene film G. Layer L can comprise, for example, a growth substrate, e.g., a metal substrate, or a target substrate, e.g., a glass substrate, or any other suitable layer. For example, the layer L can include any desired material, such as transparent or non-transparent materials, e.g., glass, glass-ceramic, crystalline materials such as sapphire, plastics, polymers, metals, and the like. Suitable metal layers L can include, for instance, copper, nickel, cobalt, alloys thereof, and combinations thereof.

In at least one non-limiting embodiment, layer L may comprise a glass substrate. Exemplary glass substrates can comprise, for example, any glass known in the art that is suitable for graphene deposition including, but not limited to, aluminosilicate, alkali-aluminosilicate, borosilicate, alkali-borosilicate, alumino-borosilicate, alkali-alumino-borosilicate, soda lime silicate, and other suitable glasses. In certain embodiments, the substrate may have a thickness of less than or equal to about 3 mm, for example, ranging from about 0.1 mm to about 2.5 mm, from about 0.3 mm to about 2 mm, from about 0.7 mm to about 1.5 mm, or from about 1 mm to about 1.2 mm, including all ranges and subranges therebetween. Non-limiting examples of commercially available glasses suitable for use include, for instance, EAGLE XG® Iris™, Lotus™, Willow®, Gorilla®, HPFS®, and ULE® glasses from Corning Incorporated. Suitable glasses are disclosed, for example, in U.S. Pat. Nos. 4,483,700, 5,674,790, and 7,666,511, which are incorporated herein by reference in their entireties.

As discussed above, the thermal release polymer T can be chosen from polydimethylsiloxanes and polyurethanes. The thermal release polymer layer T can have any thickness suitable for handling, for example, a thickness ranging from about 100 nm to about 1 mm, such as from about 200 nm to about 500 nm, or from about 300 nm to about 400 nm, including all ranges and subranges therebetween. Similarly, the polymer layer P can be chosen from poly(methyl methacrylate), poly(lactic acid), or polycarbonate. The polymer layer P can have any thickness suitable for coating the graphene film, for example, a thickness ranging from about 50 nm to about 200 nm, such as from about 100 nm to about 150 nm, including all ranges and subranges therebetween.

As used herein, the term "graphene film" is intended to denote at least one layer of graphene, e.g., from 1 to 20 layers or more. Films can be single-layer films (e.g., about 0.3-10 nm thick) or multi-layer films (e.g., [x*t] nm thick, where x is the number of layers and t is the layer thickness). The graphene film G can have any desired thickness, e.g., ranging from a few to several layers of graphene. The overall thickness of the graphene film can range, for example, from about 0.3 nm to about 200 nm, such as from about 0.7 nm to about 150 nm, from about 1 nm to about 100 nm, from about 2 nm to about 50 nm, from about 3 nm to about 40 nm, from about 4 nm to about 30 nm, from about 5 nm to about 20 nm, or from about 10 nm to about 15 nm, including all ranges and subranges therebetween.

The graphene film G can, in further embodiments, be transparent or substantially transparent. As used herein, the term "transparent" is intended to denote that the film has a transmission of greater than about 80% in the visible region of the spectrum (400-700 nm). For instance, an exemplary transparent substrate or coated substrate may have greater than about 85% transmittance in the visible light range, such as greater than about 90%, greater than about 95%, or greater than about 99% transmittance, including all ranges and subranges therebetween. According to various embodiments, the sheet resistance of the graphene film can be less than about 3 KΩ/sq, such as less than about 2 KΩ/sq, less than about 1 KΩ/sq, less than about 0.5 KΩ/sq, less than about 0.25 KΩ/sq, or less than about 0.1 KΩ/sq (e.g., ranging from about 0.1 KΩ/sq to about 3 KΩ/sq), including all ranges and subranges therebetween.

The transfer substrate depicted in FIG. 1 can include a supported substrate before etching of the growth substrate (e.g., a TRT-PMMA-graphene-metal stack) or a supported substrate after etching and contact with a target substrate (e.g., a TRT-PMMA-graphene-glass stack). Alternatively, in the absence of a layer L, the transfer substrate can comprise a graphene layer supported by a polymer layer and a thermal release polymer layer (e.g., a TRT-PMMA-graphene stack). In the case of a transfer substrate comprising a target substrate layer L, upon removal of the thermal release polymer layer T and the polymer layer P, a target substrate (e.g., glass substrate) coated with a graphene layer (L+G) can be obtained. Such coated target substrates may have one or more advantages over coated substrates formed using prior art transfer methods. For example, the coated target substrate may exhibit one or more of a more uniform and/or complete graphene coating (e.g., greater than about 90%, 95%, 97%, or 99% coverage), increased transmittance (e.g., greater than about 80%, 85%, 90%, 95%, 97%, or 99% transmittance), and/or decreased resistance (e.g., less than about 3 KΩ/sq, 2 KΩ/sq, 1 KΩ/sq, 0.5 KΩ/sq, or 0.1 KΩ/sq). Of course it is to be understood that the coated target substrates may not exhibit one or more of the above advantages but are still intended to fall within the scope of the disclosure.

It will be appreciated that the various disclosed embodiments may involve particular features, elements or steps that are described in connection with that particular embodiment. It will also be appreciated that a particular feature, element or step, although described in relation to one particular embodiment, may be interchanged or combined with alternate embodiments in various non-illustrated combinations or permutations.

It is also to be understood that, as used herein the terms "the," "a," or "an," mean "at least one," and should not be limited to "only one" unless explicitly indicated to the contrary. Thus, for example, reference to "a layer" includes examples having two or more such layers unless the context clearly indicates otherwise. Likewise, a "plurality" is intended to denote "more than one." As such, a "plurality of layers" includes two or more such layers, such as three or more such layers, etc.

Ranges can be expressed herein as from "about" one particular value, and/or to "about" another particular value. When such a range is expressed, examples include from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

The terms "substantial," "substantially," and variations thereof as used herein are intended to note that a described feature is equal or approximately equal to a value or description. For example, a "substantially planar" surface is intended to denote a surface that is planar or approximately planar. Moreover, as defined above, "substantially similar" is intended to denote that two values are equal or approximately equal. In some embodiments, "substantially similar" may denote values within about 10% of each other, such as within about 5% of each other, or within about 2% of each other.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a method that comprises A+B+C include embodiments where a method consists of A+B+C and embodiments where a method consists essentially of A+B+C.

It will be apparent to those skilled in the art that various modifications and variations can be made to the present disclosure without departing from the spirit and scope of the disclosure. Since modifications combinations, sub-combinations and variations of the disclosed embodiments incorporating the spirit and substance of the disclosure may occur to persons skilled in the art, the disclosure should be construed to include everything within the scope of the appended claims and their equivalents.

The following Examples are intended to be non-restrictive and illustrative only, with the scope of the invention being defined by the claims.

EXAMPLES

Glass substrates (Corning Willow® glass, 25.4×25.4 mm×150 μm thick) comprising graphene films were prepared according to the following methods. The glass substrates were pre-treated by (1) contacting the substrate using a 750 W $O_2$ plasma for 3 minutes, (2) contacting the substrate with a 5:1:1 $H_2O:H_2O_2:NH_4OH$ solution at 25° C. for 15 minutes, (3) contacting the substrate with a 5:1:1 $H_2O:H_2O_2:HCl$ solution at 25° C. for 15 minutes, and (4) rinsing the substrate for 10 minutes in deionized water while applying ultrasonic energy. Immediately prior to transfer, the glass substrate was again treated for 30 seconds with 750 W $O_2$ plasma. The transferred films were characterized by Raman spectroscopy, UV-Vis spectrophotometry, and four point probe measurements, to respectively determine the continuity and quality, optical transmittance, and sheet resistance of the films.

Example 1: Graphene Transfer Using TRT+PMMA Support

CVD-grown monolayer graphene films on copper growth substrates were obtained (Graphenea, Spain) and treated by (1) spin coating the graphene film with PMMA, (2) thermally treating the PMMA-graphene-copper stack at 90° C. for 2 minutes, (3) pressing TRT onto the PMMA layer using a roller, (4) etching the copper in 1.0 M $FeCl_3$ at 60° C. for 30 minutes, (5) rinsing the TRT-PMMA-graphene stack with deionized water, (6) contacting the exposed graphene surface with a pre-treated Willow® glass sample and pressing with a roller, (7) heating the TRT-PMMA-graphene-glass stack to 125° C. and peeling off the TRT, (8) soaking the PMMA-graphene-glass stack in N-methyl-2-pyrrolidone for 3.5 hours to soften the PMMA, (9) soaking the PMMA-graphene-glass stack in acetone at room temperature for 20 minutes to remove the PMMA, (10) rinsing the graphene-glass substrate in isopropanol, and (11) annealing the graphene film at 200° C. for 1 hour under vacuum.

Figure 2A:
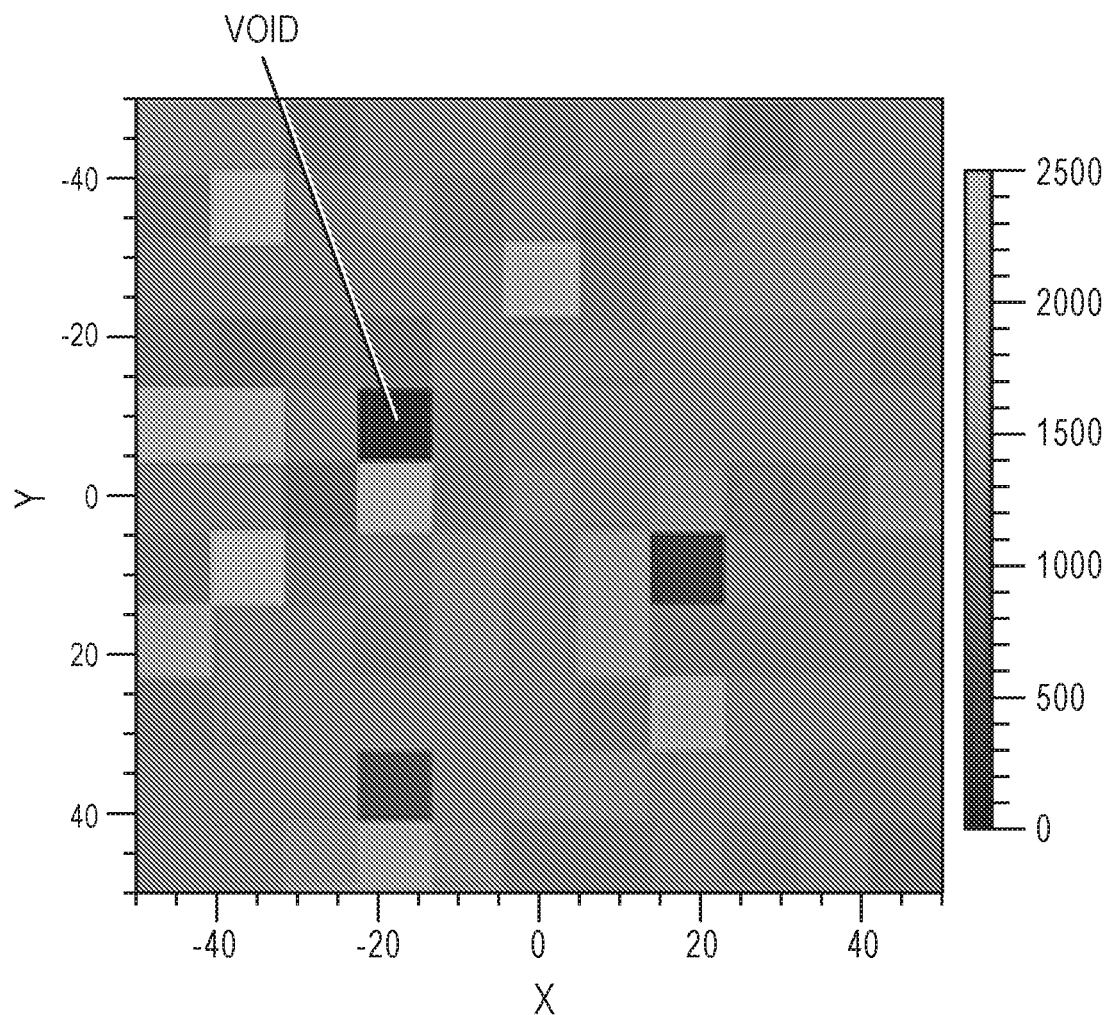
FIG. 2A is a 2D Raman mapping image of a graphene film transferred onto a glass substrate using a method according to various embodiments of the disclosure.
Figure 2B:
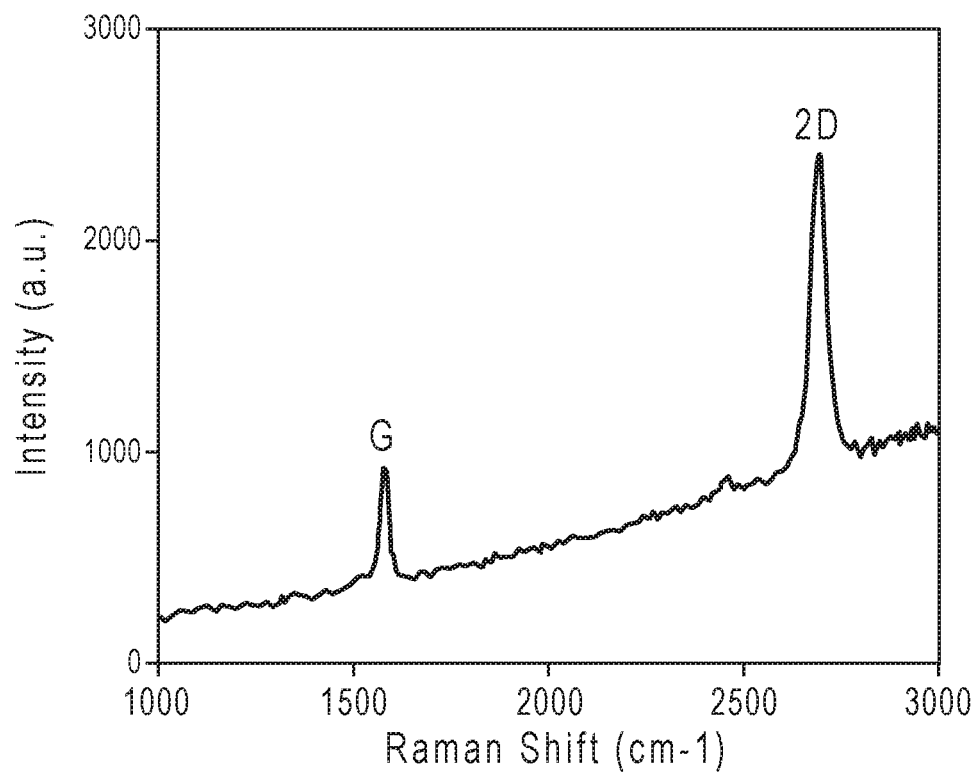
FIG. 2B is a Raman spectrum of a graphene film transferred onto a glass substrate using a method according to various embodiments of the disclosure.
Figure 2C:
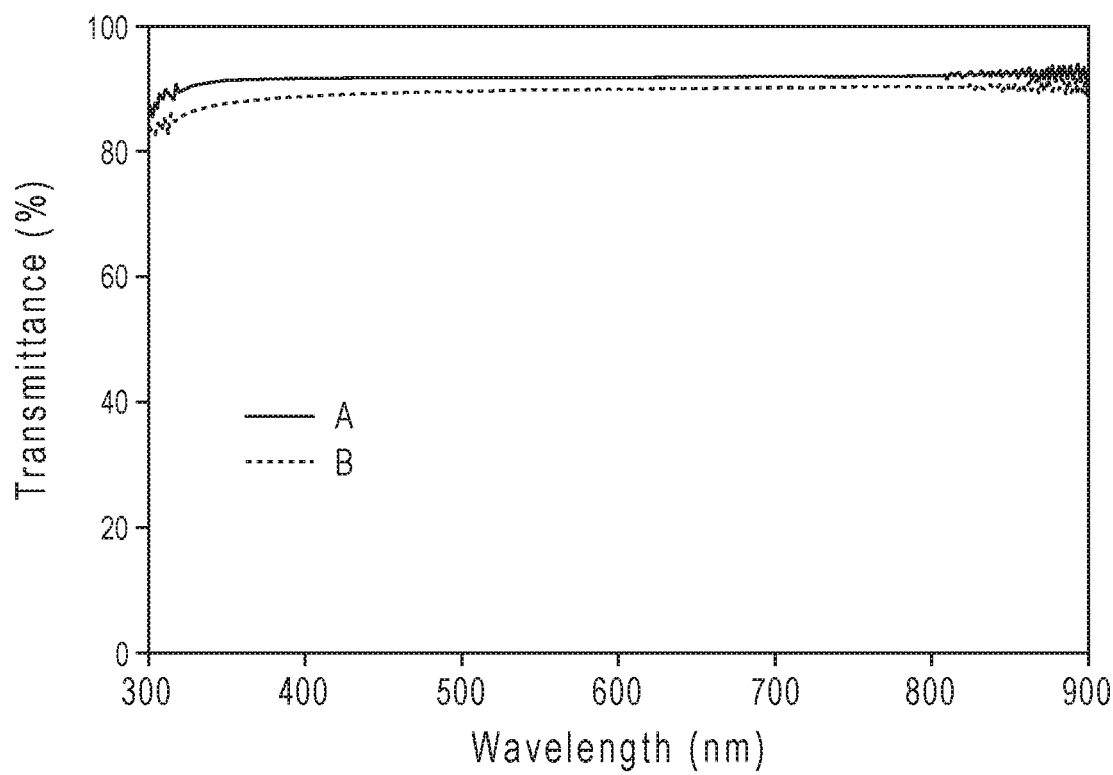
FIG. 2C is an optical transmittance spectrum of a glass substrate without a graphene film and with a graphene film transferred using a method according to various embodiments of the disclosure.

FIG. 2A is a 2D Raman mapping image (mapping scale 100 μm×100 μm) of the transferred monolayer graphene film on the Willow® substrate, with voids indicated by black squares. Coverage of the Willow® substrate using this method was estimated at greater than 97%. FIG. 2B is the Raman spectrum of the monolayer graphene film on the Willow® substrate. The absence of a D peak in the spectrum is indicative of the high quality of the transferred graphene film. FIG. 2C is the optical transmittance spectrum of the Willow® substrate with (dashed line B) and without (solid line A) the transferred graphene film. The measured visible transmittance of the glass with and without the graphene film was 90.1% and 92.2%, respectively. The relative transmittance at 550 nm was determined as 97.7%, which indicates that the monolayer graphene film absorbs only 2.3% of light at that wavelength. The graphene film transferred using this method did not have a measurable sheet resistance (KΩ/sq).

Example 2 (Comparative): Graphene Transfer Using TRT Support

CVD-grown monolayer graphene films on copper growth substrates were obtained (Graphenea, Spain) and treated by (1) placing TRT on the graphene film, (2) placing the TRT-graphene-copper stack between two steel plates and applying pressure (740 psi) for 30 seconds, (3) removing graphene from the reverse side of the copper foil by dipping in 10 wt % nitric acid for 2 minutes, (4) etching the copper in 1.0 M FeCl₃ at 60° C. for 30 minutes, (5) placing the TRT-graphene stack on a pre-treated Willow® glass sample, (6) placing the TRT-graphene-glass stack in the press and applying pressure (180 psi) for 1 minute, (7) heating to 125° C. and peeling off the TRT, (8) removing adhesive residues from the graphene surface with methanol-toluene-acetone mixture (1:1:1 by volume), and (9) annealing the graphene film at 200° C. for 1 hour under vacuum.

Figure 3A:
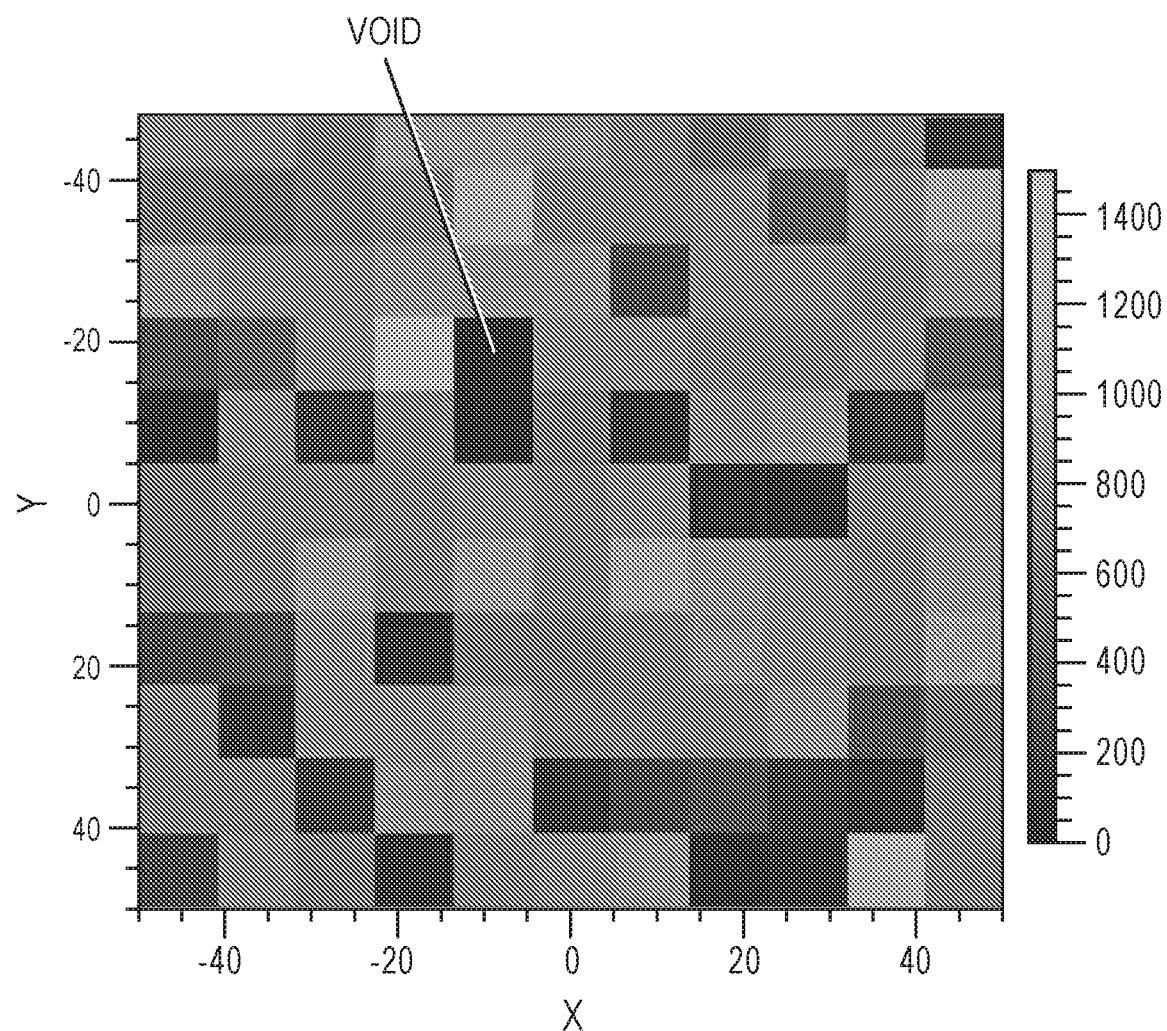
FIG. 3A is a 2D Raman mapping image of a graphene film transferred onto a glass substrate using a TRT transfer method.
Figure 3B:
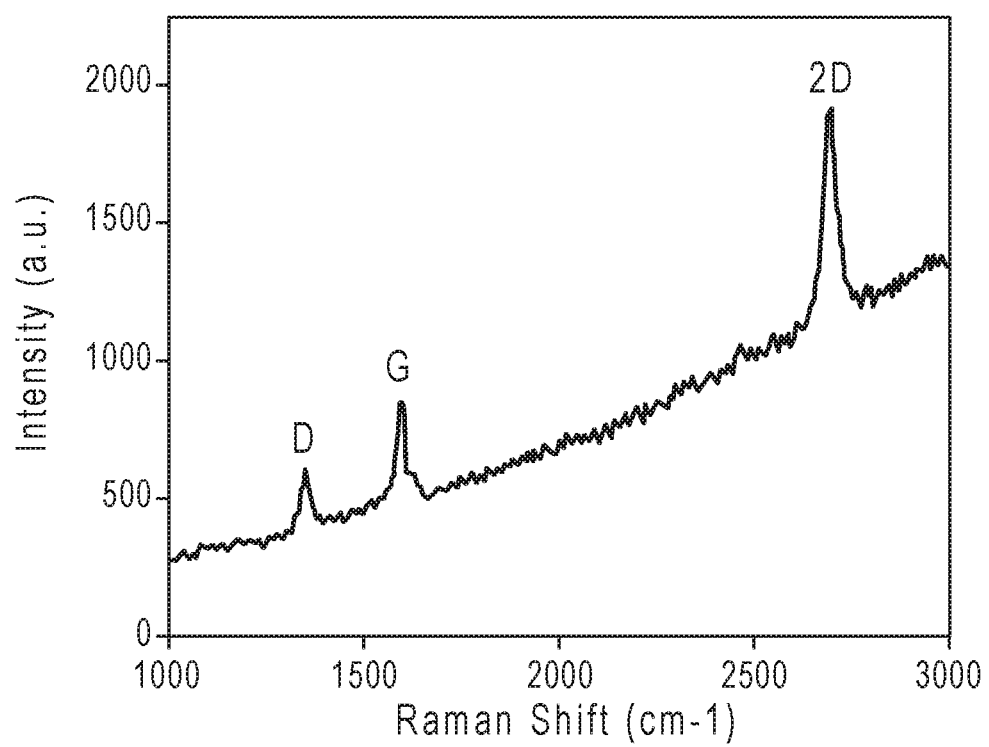
FIG. 3B is a Raman spectrum of a graphene film transferred onto a glass substrate using a TRT transfer method.
Figure 3C:
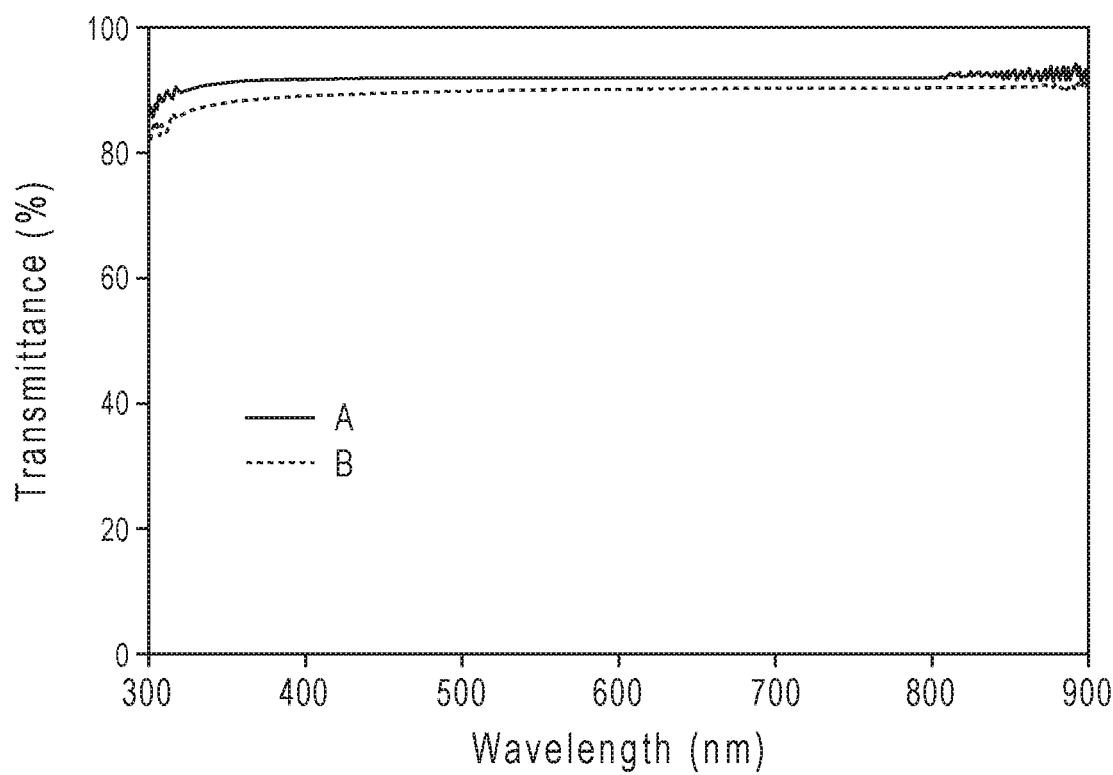
FIG. 3C is an optical transmittance spectrum of a glass substrate without a graphene film and with a graphene film transferred using a TRT transfer method.

FIG. 3A is a 2D Raman mapping image (mapping scale 100 μm×100 μm) of the transferred monolayer graphene film on the Willow® substrate, with voids indicated by black squares. Coverage of the Willow® substrate using this method was estimated at 88%. FIG. 3B is the Raman spectrum of the monolayer graphene film on the Willow® substrate. The presence of a D peak in the spectrum suggests the presence of defects in the transferred graphene film, which may be attributable to mechanical deformation induced by pressing the TRT onto the graphene surface. FIG. 3C is the optical transmittance spectrum of the Willow® substrate with (dashed line B) and without (solid line A) the transferred graphene film. The measured visible transmittance of the glass with and without the graphene film was 90.2% and 92.2%, respectively. The graphene film transferred using this method did not have a measurable sheet resistance (KΩ/sq).

Example 3 (Comparative): Graphene Transfer Using PMMA Support

CVD-grown monolayer graphene films on copper growth substrates were obtained (Graphenea, Spain) and treated by (1) coating the graphene film with PMMA by spin coating at 4000 rpm for 50 seconds, (2) thermally treating the PMMA-graphene-copper stack at 120° C. for 1 hour, (3) floating the PMMA-graphene-copper stack in 1.0 M FeCl₃ at 60° C. for 30 minutes to remove the copper layer, (4) contacting the exposed graphene surface with a pre-treated Willow® glass sample, (5) soaking the PMMA-graphene-glass stack in N-methyl-2-pyrrolidone for 3.5 hours to soften the PMMA, (6) soaking the PMMA-graphene-glass stack in acetone at room temperature for 20 minutes to remove the PMMA, (7) rinsing the graphene-glass substrate methanol-water (1:1 by volume), and (8) annealing the graphene film at 200° C. for 1 hour under vacuum.

Figure 4A:
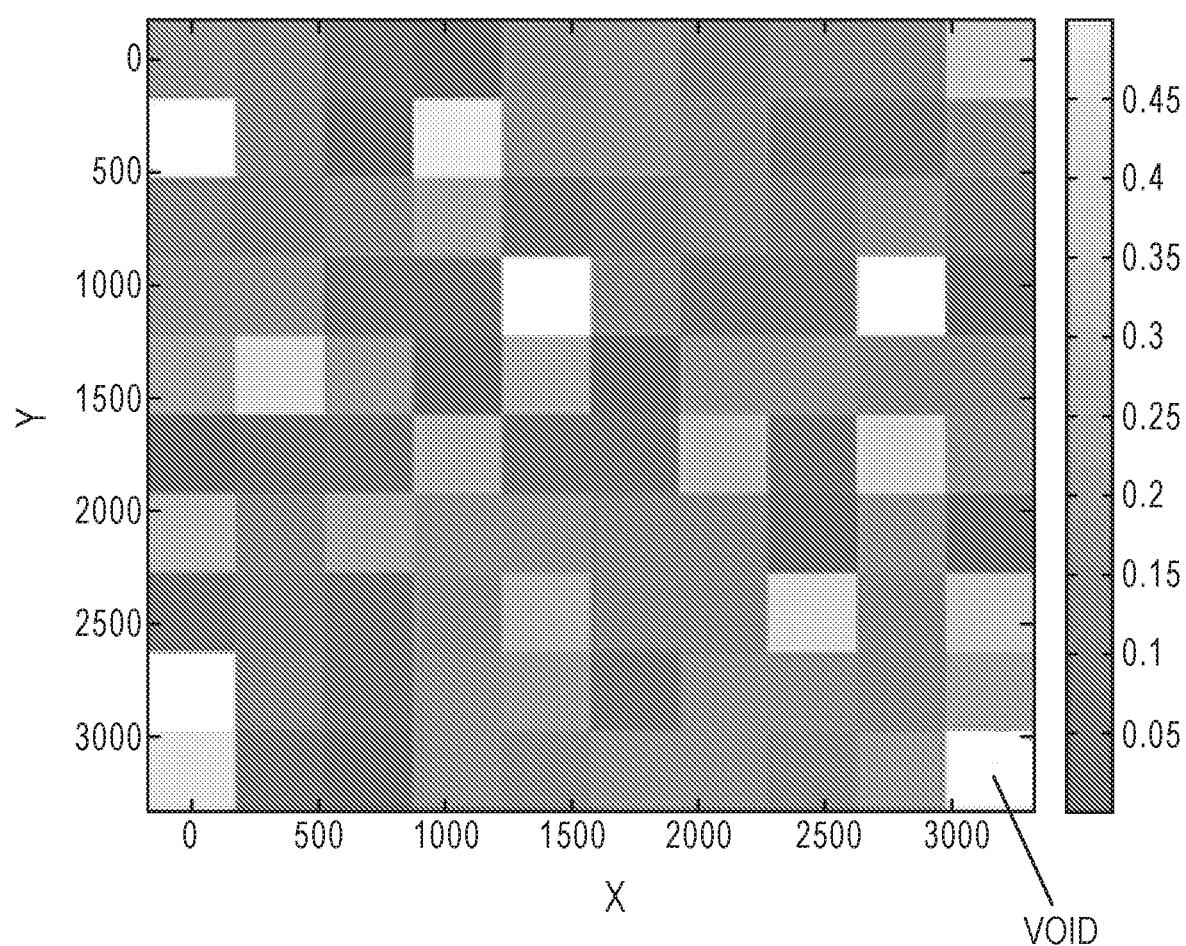
FIG. 4A is a 2D Raman mapping image of a graphene film transferred onto a glass substrate using a PMMA transfer method.
Figure 4B:
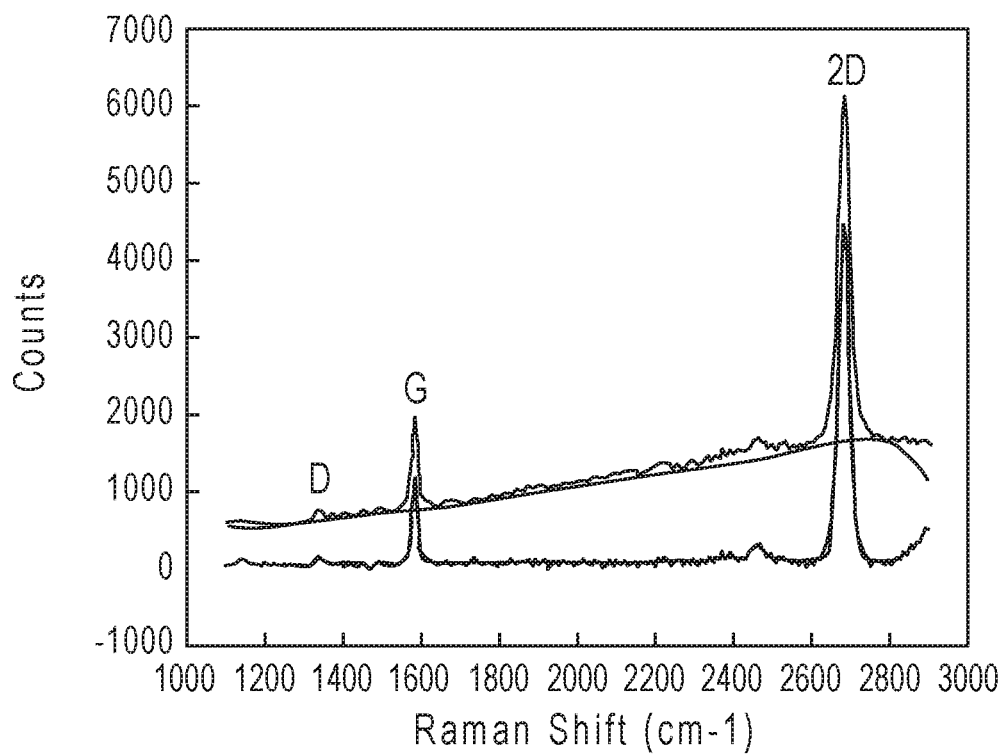
FIG. 4B is a Raman spectrum of a graphene film transferred onto a glass substrate using a PMMA transfer method.
Figure 4C:
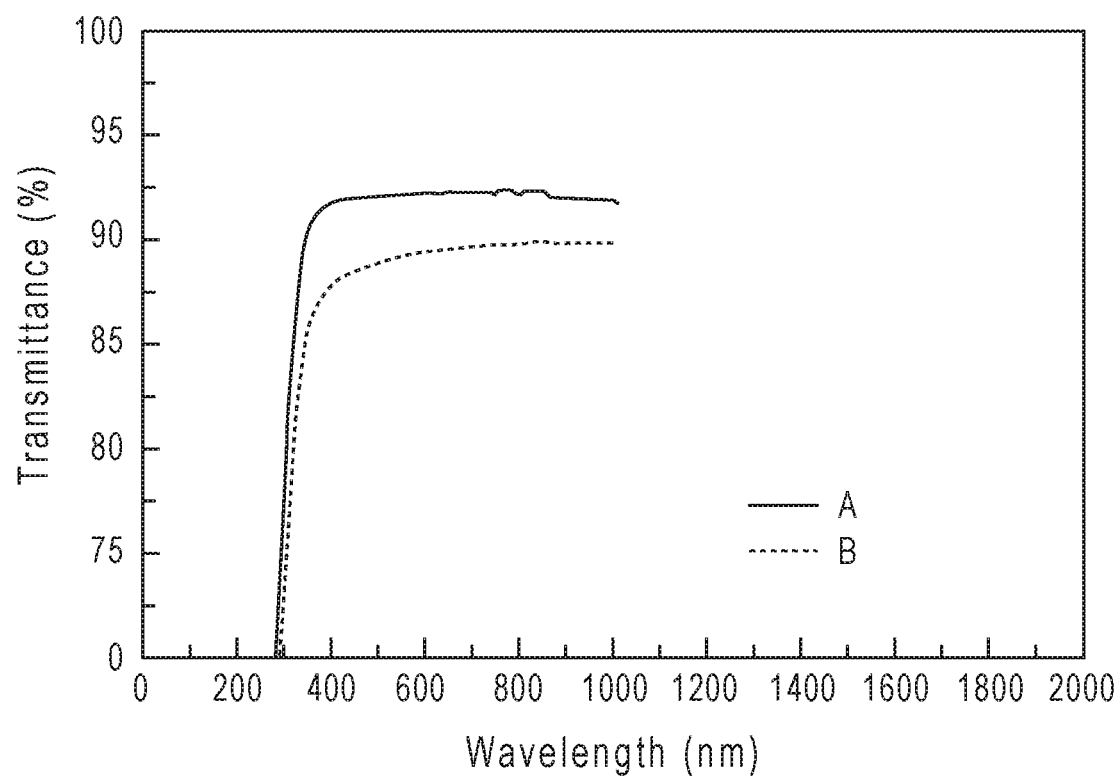
FIG. 4C is an optical transmittance spectrum of a glass substrate without a graphene film and with a graphene film transferred using a PMMA transfer method.

FIG. 4A is a 2D Raman mapping image (mapping scale 100 μm×100 μm) of the transferred monolayer graphene film on the Willow® substrate, with voids indicated by white squares. Coverage of the Willow® substrate using this method was estimated at 90%. FIG. 4B is the Raman spectrum of the monolayer graphene film on the Willow® substrate. The presence of a low intensity D peak in the spectrum suggests the presence of a small number of defects in the transferred graphene film, which may be attributable to wrinkles and/or holes formed during handling. FIG. 4C is the optical transmittance spectrum of the Willow® substrate with (dashed line B) and without (solid line A) the transferred graphene film. The measured visible transmittance of the glass with and without the graphene film was 90% and 92.3%, respectively. The graphene film transferred using this method had a measurable sheet resistance of 0.5-1.5 KΩ/sq.

The observed properties of the films transferred using the methods of Examples 1-3 are reproduced below in Table I.

TABLE I

| | Graphene Film Properties | | | |
|---|---|---|---|---|
| Example | Film Coverage (%) | Disorder/ Defect Level ($I_D/I_G$*) | Sheet Resistance (KΩ/sq) | Visible Transmittance (%) |
| 1 | >97 | ~0 | N/A | 97.7 |
| 2 | 88 | >0.1 | N/A | 97.5 |
| 3 | 90 | <0.1 | 0.5-1.5 | 97.7 |

$I_D/I_G$: The intensity ratio of Raman D and G peaks is commonly used to characterize disorder in graphene. The smaller the ratio, the lower the number of defects in the graphene film As compared to the coated substrate produced in Example 1, the comparative substrate produced in Example 2 using the TRT-supported method exhibited inferior graphene coverage, higher defect level, and lower transmittance. The comparative substrate produced in Example 3 using the PMMA-supported method exhibited inferior graphene coverage, higher defect level, and higher resistance as compared to the coated substrate produced in Example 1.

What is claimed is:

1. A method for transferring a graphene film onto a substrate, the method comprising:
    (a) applying a polymer layer to a first surface of a graphene film, wherein a second surface of the graphene film is in contact with a growth substrate;
    (b) thermally treating the polymer layer;
    (c) applying a thermal release polymer layer to the thermally treated polymer layer;
    (d) removing the growth substrate to form a transfer substrate comprising an exposed graphene surface; and
    (e) contacting the exposed graphene surface with a target substrate.

2. The method of claim 1, wherein the growth substrate is a metal substrate.

3. The method of claim 1, further comprising depositing the graphene film on the growth substrate by chemical vapor deposition or plasma-enhanced chemical vapor deposition.

4. The method of claim 1, wherein the polymer layer comprises poly(methyl methacrylate), poly(lactic acid), or polycarbonate.

5. The method of claim 1, wherein applying the polymer layer comprises dip coating, spin coating, or spray coating the polymer onto the graphene film.

6. The method of claim 1, wherein thermally treating the polymer comprises heating the polymer layer to a temperature ranging from about 80° C. to about 150° C. for a period of time ranging from about 1 minute to about 60 minutes.

7. The method of claim 1, wherein the thermal release polymer layer comprises polydimethylsiloxane or polyurethane.

8. The method of claim 1, wherein applying the thermal release polymer layer comprises pressing, roll-to-roll transfer, or lamination.

9. The method of claim 1, wherein removing the growth substrate comprises exposing the growth substrate to an etchant at a temperature ranging from about 25° C. to about 60° C. for a time period ranging from about 30 minutes to about 12 hours.

10. The method of claim 1, wherein the target substrate comprises glass.

11. The method of claim 1, further comprising removing the thermal release polymer by heating to a temperature ranging from about 100° C. to about 200° C. and peeling away the thermal release polymer.

12. The method of claim 11, further comprising removing the polymer layer by exposing the polymer layer to an organic solvent at a temperature ranging from about 25° C. to about 60° C. for a time period ranging from about 15 minutes to about 60 minutes.

13. The method of claim 12, further comprising annealing the graphene film at a temperature ranging from about 100° C. to about 400° C. for a time period ranging from about 15 minutes to about 60 minutes, optionally under vacuum.

14. A transfer substrate comprising a graphene film, a thermal release polymer layer, and a polymer layer disposed therebetween, wherein the polymer layer has a thickness ranging from 50 nm to 200 nm.

15. The transfer substrate according to claim 14, wherein the thermal release polymer layer comprises polydimethylsiloxane or polyurethane.

16. The transfer substrate of claim 14, wherein the polymer layer comprises poly(methyl methacrylate), poly(lactic acid), or polycarbonate.

17. The transfer substrate of claim 14, wherein the thermal release polymer has a thickness ranging from about 100 nm to about 1 mm.

18. The transfer substrate of claim 14, wherein the graphene film has a thickness ranging from about 0.3 nm to about 200 nm.

19. The transfer substrate of claim 14, wherein the graphene film is substantially transparent.

20. The transfer substrate of claim 14, wherein the graphene film has a sheet resistance of less than about 3 KΩ/sq.

* * * * *